United States Patent [19]

Matsushima et al.

[11] Patent Number: 4,918,496
[45] Date of Patent: Apr. 17, 1990

[54] INFRARED EMITTING DEVICE WITH DISLOCATION FREE LAYER

[75] Inventors: Yuichi Matsushima, Tanashi; Kazuo Sakai; Shigeyuki Akiba, both of Tokyo; Katsuyuki Utaka, Musashino, all of Japan

[73] Assignee: Kokusai Denshin Denwa Kabushiki Kaisha, Tokyo, Japan

[21] Appl. No.: 213,608

[22] Filed: Jun. 30, 1988

[30] Foreign Application Priority Data

Jul. 2, 1987 [JP] Japan .................. 62-163903

[51] Int. Cl.$^4$ .............................. H01L 33/00
[52] U.S. Cl. ...................... 357/17; 357/16; 357/4
[58] Field of Search ................ 357/17, 16, 4

[56] References Cited

U.S. PATENT DOCUMENTS 4,599,728 7/1986 Alavi et al. .............. 357/17 X

FOREIGN PATENT DOCUMENTS

| 0186336 | 7/1986 | European Pat. Off. | 357/4 |
| 57-152178 | 9/1982 | Japan | 357/4 |
| 58-207684 | 12/1983 | Japan | 357/4 |
| 8701522 | 8/1986 | World Int. Prop. O. | 357/4 |

OTHER PUBLICATIONS

Levine et al., "InGaAs/InAlAs Multiquantum Well Intersubband, Absorption at a Wavelength of $\lambda=4.4$ μm," *Appl. Phys. Lett.*, 52 (18) May 1, 1988, pp. 1481–,1483.

Tsang, "$Ga_{0.47}In_{0.53}As$/InP Multiquantum Well Heterostructure Lasers Grown by Molecular Beam Epitaxy Operating at 1.53 μm," *Appl. Phys. Lett.*, 44(3) Feb. 1, 84, 288–90.

Peng et al., "Extremely Low Resistance Nonalloyed Ohmic Contacts on GaAs Using InAs/InGaAs and InAs/GaAs Strained Layer Superlattices," *Appl Phys., Lett.*, 53(10), Sep. 5, 1988, pp. 900–901.

Capasso et al., "New Avalanche Multiplication Phenomenon In Quantum Well Superlattices: Evidence of Impact Ionization Across The Band–Edge Discontinuity," *Appl. Phys., Lett.* 48(19), May, 12, 1985, pp. 1294–1296.

*Primary Examiner*—William Mintel
*Attorney, Agent, or Firm*—Emmanuel J. Lobato; Robert E. Burns

[57] ABSTRACT

An infrared emitting device for use in the 2 to 3 μm region, which is low in the threshold current and operates over a wide temperature range. In accordance with the present invention, an InP substrate is employed in place of GaSb substrate and InAs substrate heretofore employed for the 2 to 3 μm infrared semiconductor lasers. Moreover, as active layers or clad layers, one of more semiconductor layers are employed which differ in lattice constant from the InP substrate.

7 Claims, 7 Drawing Sheets

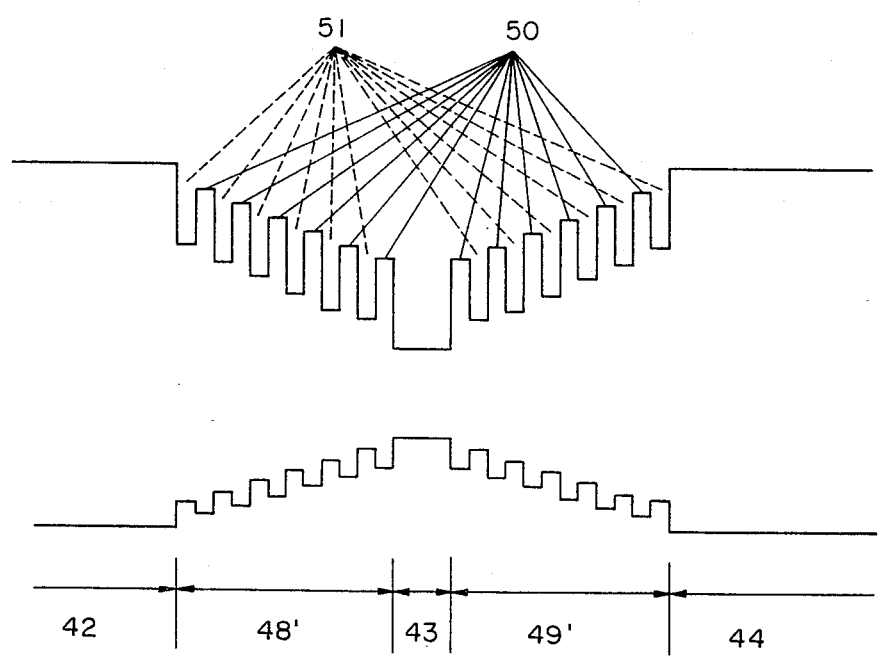

INFRARED EMITTING DEVICE WITH DISLOCATION FREE LAYER

BACKGROUND OF THE INVENTION

The present invention relates to a semiconductor infrared emitting device for use in a 2 to 3 μm wavelength region.

The transmission loss of an optical silica fiber has now been reduced down to 0.2 dB/km in a 1.5 μm region, which is substantially equal to a theoretical limit. On the other hand, study is being given a fluoride glass fiber whose transmission loss is expected to be 1 to 2 orders of magnitude lower than that of the optical silica fiber. The fluoride glass fiber exhibits a low transmission loss in the 2 to 3 μm region, wherein a very low loss of 0.01 to 0.001 dB/km is anticipated. It is now being considered that a non-repeated optical transmission system over 1000 km will become a reality in the future through utilization of the fluoride glass fiber in combination with light emitting and receiving devices intended for use in the 2 to 3 μm region.

A semiconductor laser is considered excellent, as a light emitting device for use in the 2 to 3 μm region, in terms of operability and reliability. As infrared semiconductor lasers for use in this wavelength region there have been studied so far a semiconductor laser which has an active layer formed of GaInAsSb lattice-matched with a GaSb substrate and a semiconductor laser which has an active layer formed of InAsPSb lattice-matched with an InAs substrate. From the viewpoint of the operating temperature range the infrared semiconductor laser which includes the GaInAsSb active layer and AlGaAsSb clad layers on the GaSb substrate has been developed most, and its pulse oscillation at room temperature has been reported. With the use of semiconductor materials of this series, however, it is very difficult to obtain a GaInAsSb active layer composition corresponding to an energy gap of 0.35 to 0.5 eV, because of the presence of a miscibility gap. This indicates difficulty in manufacturing, through use of semiconductor materials of this kind, an infrared semiconductor laser which emits light at a wavelength of 2.5 to 2.7 μm or 3.5 μm where the fluoride glass fiber is considered to exhibit a low loss. In fact, the longest wavelength of light emitted by the infrared semiconductor laser made of this kind of materials so far is about 2.2 μm.

On the other hand, in the infrared semiconductor laser of the InAsPSb alloy formed on the InAs substrate, both the active layer and the clad layer can be formed of the same semiconductor materials and an active layer of a composition which emits light at the 2.5 to 2.7 μm wavelength can also be obtained. However, the semiconductor materials of this series also presents the above-mentioned miscibility gap, which constitutes an obstacle to the formation of a clad layer of a large energy gap. The upper limit of the energy gap of the InAsPSb is estimated to be about 0.6 eV at an absolute temperature of 77K. On this account, in a case where the energy gap of the active layer is selected to be 0.5 eV (corresponding to a 2.5 μm wavelength), the barrier height for carrier confinement, which is defined by a difference in energy gap between the clad layer and the active layer, is only 0.1 eV at the most. As a result of this, a threshold current value for lasing increases, limiting the working temperature to a low temperature range of between 77 and 150K.

Furthermore, a non-radiative recombination process by the Auger effect in the semiconductor forming the active layer becomes marked in the 2 to 3 μm region, and this also constitutes one of the obstacles to a low threshold value and a high-temperature operation.

In the manufacture of an infrared semiconductor laser for operation in the 2 to 3 μm region through use of materials which satisfy the requirement of lattice matching of both the active layer and the clad layer with the substrate as described above, the substrate will be limited to the GaSb or InAs substrate and the active layer will have to be formed of the GaInAsSb or InAsPSb layer. In this instance, however, the above-mentioned problem inherent to the bulk semiconductor still remains unsolved. This makes it difficult to realize an infrared semiconductor laser for fluoride glass fiber optical communication which operates with a low threshold current and at high temperatures.

SUMMARY OF THE INVENTION

An object of the present invention is to provide an infrared emitting device for use in the 2 to 3 μm region which obviates the above-mentioned defects of the prior art and which is low in the threshold current and operates over a wide temperature range.

The present invention has its feature in using an InP substrate in place of the GaSb and InAs substrates heretofore employed for the 2 to 3 μm infrared semiconductor lasers and in using, as active layers or clad layers, one or more semiconductor layers which differ in lattice constant from the InP substrate.

BRIEF DESCRIPTION OF THE DRAWINGS

The present invention will be described in detail below with reference to the accompanying drawings, in which:

FIGS. 3A, 3B, 4A, 4B, 5A, 5B, 5C, 6A and 6B are diagrams illustrating the laser structures of second to fifth embodiments of the present invention and their energy gaps.

DETAILED DESCRIPTION

A description will be given first of the principle of the present invention.

Figure 1:
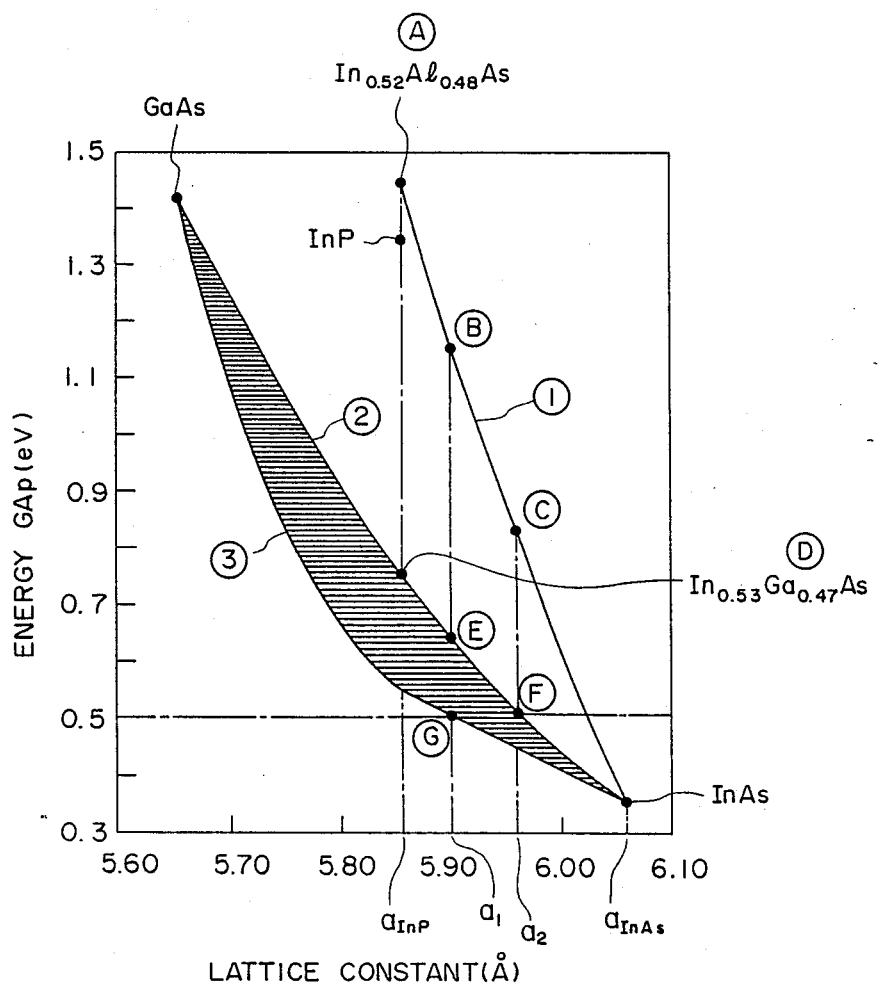
FIG. 1 is a diagram showing lattice constants and energy gaps of $In_xGa_{1-x}As$ and $In_yAl_{1-y}As$ and an $In_xGa_{1-x}As/In_{x'}Ga_{1-x'}As$ strained-layer superlattice on an InP substrate for explaining the principle of the present invention.

FIG. 1 is a graph showing the relationship between the lattice constant a and the energy gap Eg of each semiconductor for explaining the principle of the present invention. In FIG. 1 there are indicated by points (A) to (F) those compositions of $In_xGa_{1-x}As$ and $In_yAl_{1-y}As$ ternary compounds for use in the present invention to which particular attention will be given. The points (A) and (D) indicate compositions $In_yAl_{1-y}As$ (where y=0.52) and $In_xGa_{1-x}As$ (where x=0.53) both of which are lattice-matched with the InP substrate. As the value of y in the composition $In_yAl_{1-y}As$ increases from 0.52 to 1 along the curve (1) [(A)→(B)→(C)→InAs], the energy gap Eg decreases.

Similarly, as the value of x in the composition $In_xGa_{1-x}As$ increases from 0 to 1 along the curve (2) [GaAs→(D)→(E)→(F)→InAs], the energy gap Eg decreases. The point (F) indicates a composition $In_xGa_{1-x}As$ corresponding to the 0.52 eV energy gap, which is equivalent to 2.5 μm in terms of wavelength. The point (C) indicates a composition $In_yAl_{1-y}As$ which has the same lattice constant as that of the composition $In_xGa_{1-x}As$ at the point (F). On the other hand, the curve (3) [GaAs→(G)→InAs] shows the lowest quantum energy at a limit of the thickness of a well layer of a $In_xGa_{1-x}As$ and $In_{x'}Ga_{1-x'}As$ (where $x \neq x'$) strainedlayer superlattice, the values shown being quoted from Osborn's calculations (Journal of Vacuum Science and Technology, Vol. B1, No. 2, p. 381). The strained-layer superlattice has its features in that since a difference in the lattice constant is reduced in the form of an internal stress, crystal growth can be achieved with no dislocation which arises from lattice mismatch, and in that the lattice constant a and the energy gap Eg (quantum level energy) can be controlled by the layer thickness ratio due to the influence of strain. That is, in the case of such a strained-layer superlattice, the lattice constant and the energy gap of a ternary compound material can also be controlled independently as in the case of a quaternary mixed crystal. The hatched area in FIG. 1 indicates $In_xGa_{1-x}As$ and $In_{x'}Ga_{1-x'}As$ (where $x = x'$) strained-layer superlattice whose lattice constants and energy gaps are controllable. As can be been from FIG. 1, all the strainedlayer superlattices on the straight line joining the points (G) and (F) have an energy gap of 0.5 eV. Indicated by the points (B) and (E) are compositions $In_yAl_{1-y}As$ and $In_xGa_{1-x}As$ which are lattice matched with the strained-layer superlattice (G).

Based on the above-described principle, the present invention provides a 2 to 3 μm infrared emitting device in which at least one of a lattice mismatch relaxation layer and a strained-layer superlattice of different lattice constants is formed, as an active layer or clad layer, on the InP substrate.

Next, embodiments of the invention will be described one by one.

1st Embodiment

Figure 2A:
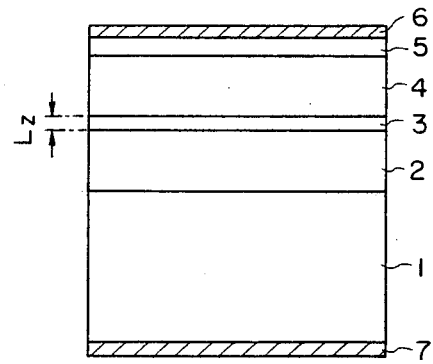
FIGS. 2A and 2B are a schematic sectional view of the laser of a first embodiment of the present invention and a diagram showing the energy gap in the vicinity of its active layer.
Figure 2B:
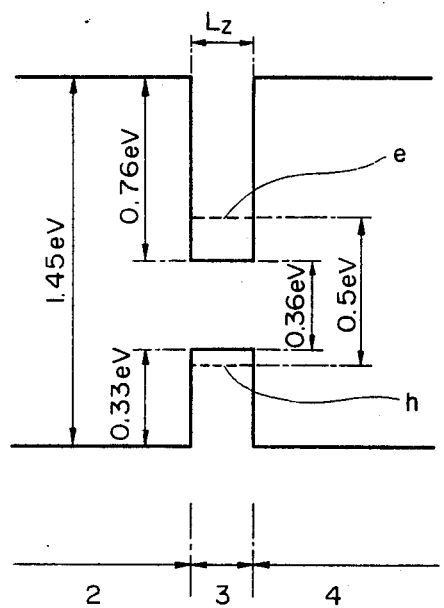

FIG. 2 illustrates an infrared semiconductor laser structure in which an active layer 3 is a single quantum well layer of InAs in accordance with a first embodiment of the present invention. FIG. 2A is a schematic sectional view of the infrared semiconductor laser and FIG. 2B a diagram showing the energy gap in the vicinity of the active layer 3. As depicted in FIG. 2A, the infrared semiconductor laser comprises an InP substrate 1, a first $In_{0.52}Al_{0.48}As$ clad layer 2 which is latticematched with the substrate 1, an active layer 3 formed by an InAs single quantum well layer of a thickness Lz less than or approximately equal to 200 Å, a second $In_{0.52}Al_{0.48}As$ clad layer 4, an $In_{0.53}Ga_{0.47}As$ contact layer 5, and electrodes 6 and 7. In this case, the lattice constant $a_{InAs}$ of the active layer 3 is greater than the lattice constants $a_{InP}$ of the substrate 1 and the clad layers 2 and 4 (The lattice constants of the clad layers 2 and 4 are equal to the lattice constant of the substrate 1, and hence will be identified by $a_{InP}$ in common to them.), and the lattice mismatching ratio of the active layer to the substrate and the clad layers, $(a_{InAs} - a_{InP})/a_{InP}$, is 3.2%. With such a small thickness as 200 Å or less as in this embodiment, however, the InAs layer can sufficiently be used as light emitting layer because no defects by the lattice mismatch will be generated due to deformation of the InAs layer itself within its elastic limit. Furthermore, the wavelength of light to be emitted can be controlled by changing the thickness Lz of the single quantum well layer. That is, by setting an energy difference between the quantum levels e and h of electrons and holes to 0.52 eV, for example, as shown in FIG. 2B, light will be emitted at the wavelength 2.5 μm. The layer thickness Lz in this instance is considered to be approximately equal to 80 Å, and such a thin layer can easily be obtained by a molecular beam epitaxy or a chemical vapor deposition process using an organic metal (MO-CVD), for instance. Moreover, barriers by the clad layers 2 and 4 against electrons and holes are as high as 0.76 and 0.33 eV, respectively, as depicted in FIG. 2B. This prevents an increase in the lasing threshold current value by overflows of the carriers, facilitating the operation of the laser at high temperatures. Important points of this embodiment are as follows: (1) Through utilization of a light emission phenomenon by the transmission between the quantum levels degradation of the temperature characteristic of the threshold current is reduced which results from the non-radiative recombination process by the Auger effect; and (2) By the introduction of lattice deformation the levels of heavy and light holes in the valance band are made reverse from those in case of a normal deformation-free quantum well, the level of the light holes contributes to the light emission, and the Auger effect is further suppressed, permitting a high-temperature operation with a small threshold value.

While this embodiment employs the $In_{0.52}Al_{0.48}As$ layer as each of the clad layers 2 and 4, the same results as those mentioned above could also be obtained by using, as each clad layer, an $In_{0.53}Ga_{0.47}As$ layer which is latticematched with the InP substrate 1.

2nd Embodiment

Figure 3A:
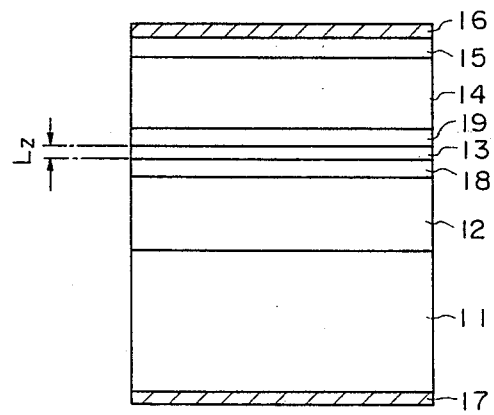
Figure 3B:
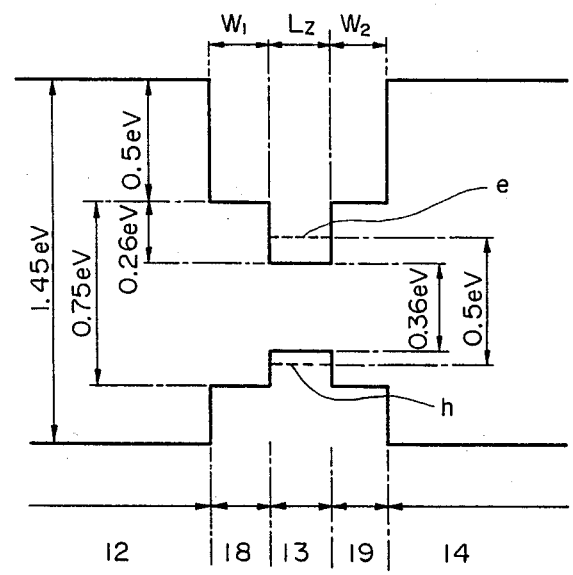

FIG. 3 illustrates a second embodiment of the present invention. This embodiment has its feature, in addition to the features of the first embodiment, in what is called a separated confinement hetero (SCH) structure in which the clad layers are each formed double so as to effectively confine light and carriers. The semiconductor laser of this embodiment comprises an InP substrate 11, $In_{0.52}Al_{0.48}As$ clad layers 12 and 14 for light confinement use, $In_{0.53}Ga_{0.47}As$ clad layers 18 and 19 for carrier confinement use, an InAs single quantum well active layer 13, and electrodes 16 and 17, as shown in FIG. 3A. FIG. 3B shows the energy gap in the neighborhood of the active layer 13 in a case where the wavelength of light to be emitted is set to 2.5 μm, reference characters e and h indicating the quantum levels of electrons and holes, respectively. In this instance, the thickness Lz of the quantum well layer 13 and the thickness $W_1$ and $W_2$ (where $W_1 = W_2$) of the clad layers 18 and 19 are about 100 and about 1000 Å, respectively. The active layer 13 formed by the InAs strained single quantum well layer produces the same effect as is obtainable in the first embodiment, and the SCH structure in this embodiment permits more reduction of the threshold current value than in the first embodiment.

3rd Embodiment

Figure 4A:
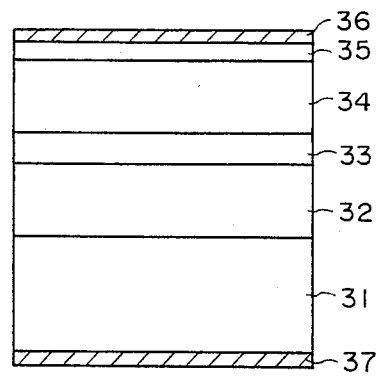
Figure 4B:
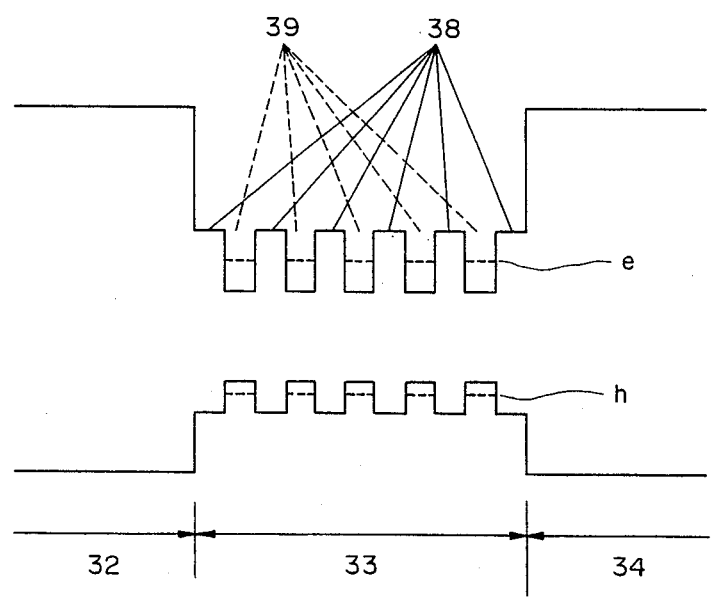

FIG. 4 illustrates a third embodiment of the infrared semiconductor laser structure of the present invention in which the active layer is a multiple quantum well layer made up of InAs and $In_{0.53}Ga_{0.47}As$. As is the case with 1st and 2nd Embodiments, FIG. 4A schematically shows the section of the laser and FIG. 4B its energy gap in the vicinity of the active layer. The laser comprises an InP substrate 31, $In_{0.52}Al_{0.48}As$ clad layers 32 and 34, an active layer 33, a contact layer 5, and electrodes 6 and 7. The active layer 33 is formed by a multiple quantum well layer including InAs layers 39 and $In_{0.53}Ga_{0.47}As$ layers 38, as depicted in FIG. 4B. As in the case of such a multiple quantum well layer, when the InAs layer is thin ($Lz \leq 200$ Å), the generation of defects which arise from lattice mismatch will be suppressed as in the case of the afore-mentioned single quantum well layer. Furthermore, light emission is also performed between the quantum levels e and h of electrons and holes in the multiple quantum well layer. The light emitting energy can be controlled by the thickness of the InAs well layer and the 2.5 μm wavelength can easily be obtained.

4th Embodiment

Figure 5A:
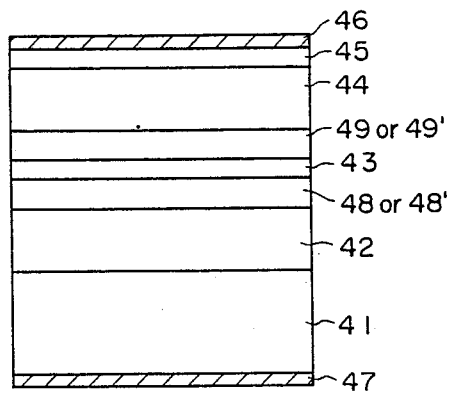
Figure 5B:
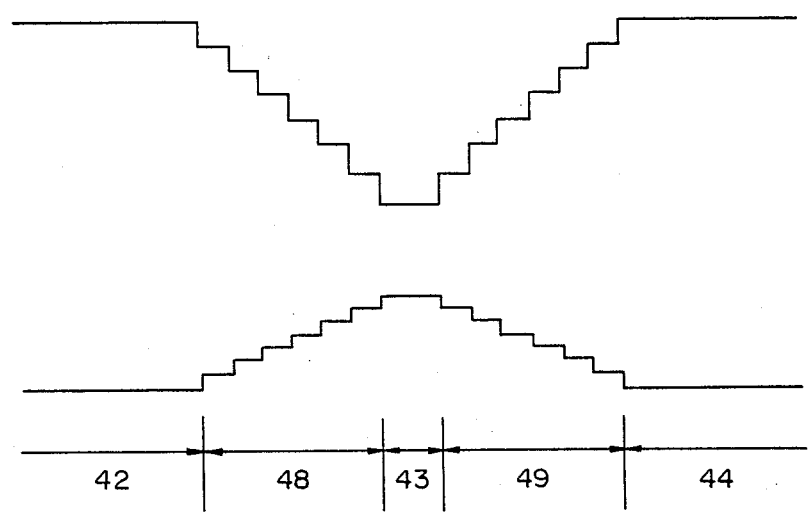

FIG. 5 illustrates a fourth embodiment of the infrared semiconductor laser of the present invention, in which the active layer is formed of $In_xGa_{1-x}As$ composition having an energy gap 0.5 eV (corresponding to the point (F) in FIG. 1). FIG. 5A schematically shows, in section, the basic structure of the laser and FIGS. 2B and 3C the energy gap in the vicinity of the active layer of lasers using clad layers of different compositions. The laser in FIG. 5A comprises an InP substrate 41, $In_{0.52}Al_{0.48}As$ clad layers 42 and 44, lattice mismatch relaxation layers 48 and 49 or lattice mixmatch relaxation layers 48' and 49', each formed by an $In_yAl_{1-y}As/In_xGa_{1-x}As$ superstructure layer, an $In_xGa_{1-x}As$ active layer 43 of the energy gap 0.5 eV, an $In_{0.53}Ga_{0.47}As$ contact layer 45 and electrodes 46 and 47. In this laser, the lattice mismatch ratio of the active layer 43 to the InP substrate 41 and the clad layers 42 and 44 is 1.7%, and with a view to relaxing this lattice mismatch, the lattice mismatch relaxation layers 48 and 49, the lattice constants of which gradually change from $a_{InP}$ to $a_2$ or from $a_2$ to $a_{InP}$ in FIG. 1, are sandwiched between the active layer 43 and the clad layers 42 and 44, respectively. FIG. 5B shows the energy gap in a case where the lattice mismatch relaxation layers 48 and 49 are each formed by the $In_yAl_{1-y}As$ layer whose composition y changes stepwise, and the composition changes from the point (A) to (C) or vice versa in FIG. 1. In this instance, a difference in the energy gap between the active layer 43 (point (F) in FIG. 1) and the lattice mismatch relaxation layers 48 and 49 (point (C) in FIG. 1) formed in contact therewith is 0.34 eV, by which carriers can be confined sufficiently. Furthermore, since the refractive indices of the lattice mismatch relaxation layers 48 and 49 are parabolic in profile, these layers each also have the function of a clad layer effective for light confinement, and accordingly a high performance 2.5 μm semiconductor laser can be obtained.

While in FIG. 5B there are shown the lattice mismatch relaxation layers 48 and 49 whose compositions change stepwise, the same effect as mentioned above would also be produced by a layer structure whose composition varies continuously, not stepwise. Moreover, the same effect as mentioned above could also obtained, as shown in FIG. 5C, by use of lattice mismatch relaxation layers each of which is formed by a superlattice structure obtained by alternately laminating an $In_yAl_{1-y}As$ layer 50 (the thickness Lz less than or approximately equal to 200 Å) the composition of which changes from the point (A) to (C) or from (C) to (A) in FIG. 1 and an $In_xGa_{1-x}As$ layer 51 (the thickness Lz less than or approximately equal to 200 Å) the composition of which changes from the point (D) to (F) or from (F) to (D) in FIG. 1.

5th Embodiment

Figure 6A:
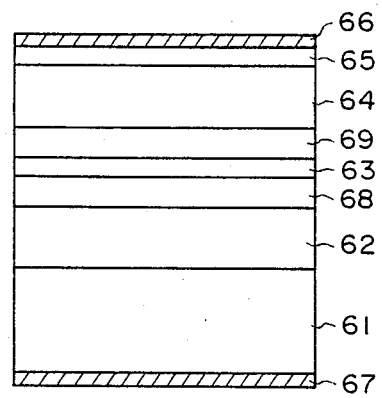
Figure 6B:
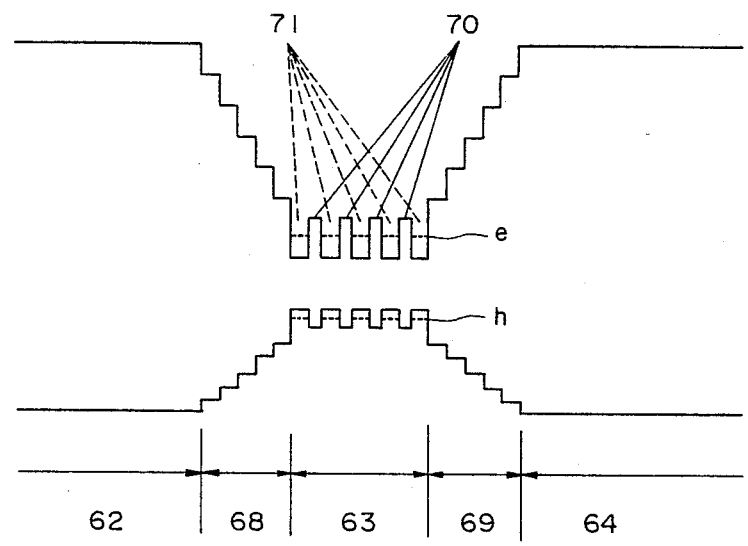

FIG. 6 illustrates a fifth embodiment of the present invention, which features the use of a strained-layer superlattice (corresponding to the point (G) in FIG. 1) for an active layer 63. FIG. 6A is a schematic sectional view of the laser, which comprises in InP substrate 61, $In_{0.52}Al_{0.48}As$ clad layers 62 and 64, a strained-layer superlattice active layer 63 composed of an $In_xGa_{1-x}As$ quantum well layer 71 (the thickness Lz of which is less than or nearly equal to 200 Å) and an $In_{x'}Ga_{1-x'}As$ barrier layer 70 (the thickness Lz of which is less than or nearly equal to 200 Å) (where $x \neq x'$), lattice mismatch relaxation layers 68 and 69, a contact layer 65, and electrodes 66 and 67. FIG. 6B shows the energy gap in the vicinity of the active layer 63. In this embodiment, the lattice mismatch ratio of the strained-layer superlattice active layer 63 to the InP substrate 61 and the clad layers 62 and 64 is 0.5%, far smaller than in the 1st to 4th Embodiments described above. On this account, the lattice mismatch between the clad layers 62 and 64 and the active layer 63 can be absorbed, with much ease, by the $In_yAl_{1-y}As$ lattice mismatch relaxation layer 68 or 69 which is shown in FIG. 6B and whose composition changes stepwise from the point (A) to (B) or (B) to (A) in FIG. 1. As referred to previously in connection with the 4th Embodiment, each of the lattice mismatch relaxation layers 68 and 69 may also be formed of a material the composition of which varies continuously (from the point (A) to (B) or (B) to (A)), or a superlattice obtained by alternately laminating an $In_yAl_{1-y}As$ layer whose composition changes from (A) to (B) or (B) to (A) and an $In_xGa_{1-x}As$ layer whose composition changes from the point (D) to (E) or (E) to (D). Moreover, in case of no employment of the lattice mismatch relaxation layers 68 and 69, the lattice mismatch as small as 0.5% can be sufficiently absorbed by the active layer 63, the strained-layer superlattice whose composition changes from the point (D) to (G) and thence back to (D) in FIG. 1. In either case, light is emitted at the 2.5 μm wavelength corresponding to the point (G); thus, an infrared semiconductor can be obtained which is capable of operating with a low threshold current and at high temperatures, as in the other embodiments.

Although in the above no particular reference has been made to the conductivity type of the semiconductor forming the infrared semiconductor laser of each embodiment, light emission can be performed very easily by using an n- or p-type substrate, forming a p-n junction near the active layer, and current injection. Furthermore, a lateral mode stabilizing structure or various buried structures for confining carriers or light in a lateral direction can also easily be implemented on the basis of the prior art. It is also possible to stabilize the longitudinal mode by providing a diffraction grating in an optical waveguide region to form a distributed feedback laser.

In the above the invention has been described with regard to the case where the wavelength of light to be emitted is 2.5 μm, but in the case of using the $In_x$-

$Ga_{1-x}As/ In_yAl_{1-y}As$ series, the wavelength can be selected up to 3.5 um corresponding to the energy gap of the InAs, by changing the composition ratio between x and y.

As described above, the 2 to 3 μm infrared emitting device of the present invention which has a lattice mismatch relaxation layer formed on an InP substrate is free from crystal defects by lattice mismatch and is capable of operating on a low threshold current at high temperatures above room temperature. Furthermore, the infrared emitting device of the present invention can be designed for emitting light over a wide wavelength range from 2 to 3 μm. In addition, since InP is used for the substrate, the device of the present invention can be integrated with electronic devices or optical waveguide devices formed on the InP substrate, and this permits the implementation of a high performance infrared emitting source. Such an infrared emitting device is applicable to the fields of ultralow loss optical fiber communication using fluoride glass fiber and optical measurement, and hence is of great utility in practical use.

What we claim is:

1. An infrared emitting device which has, on a InP substrate, an active semiconductor layer for emitting light in a 2 to 3 μm wavelength region and clad semiconductor layers directly overlying and underlying said active semiconductor layer and having an energy gap greater than that of said active semiconductor layer, characterized in that at least one of said semiconductor layers forming said active semiconductor layer and said clad layers has a lattice constant different from that of said substrate so as to obtain an energy gap necessary to sufficiently confine carriers in said active semiconductor layer and that said at least one semiconductor layer is formed to a thickness smaller than a predetermined value obtainable of crystal growth with no dislocation which arises from lattice mismatch.

2. An infrared emitting device according to claim 1, characterized in that said active semiconductor layer and said clad semiconductor layers are each formed by at least one of an $In_xGa_{1-x}As$ layer (where $0 \leq x \leq 1$) and an $In_yAl_{1-y}As$ layer (where $0 \leq y \leq 1$) both of which have a lattice constant different from said InP substrate.

3. An infrared emitting device according to claim 1, in which the lattice constant of the InP substrate is different from the lattice constant of the active semiconductor layer.

4. An infrared emitting device according to claim 1, in which the lattice constant of the InP substrate is different from the lattice constant of the clad semiconductor layer.

5. An infrared emitting device according to claim 1, in which the lattice constants of the InP substrate, the active semiconductor layer and the clad semiconductor layer are different from one another.

6. An infrared emitting device according to any one of claims 3 or 4 or 5, in which a difference between the lattice constants resides in a single semiconductor layer.

7. An infrared emitting device according to any one of claims 3 or 4 or 5, in which a difference between the lattice constants resides in a plurality of semiconductor layers in a step-wise manner.

* * * * *